(12) United States Patent
Nishikata et al.

(10) Patent No.: US 7,589,322 B2
(45) Date of Patent: Sep. 15, 2009

(54) SAMPLE MEASURING DEVICE

(75) Inventors: Kentaro Nishikata, Kyoto (JP); Yutaka Saijo, Kyoto (JP); Shigeru Kakinuma, Kyoto (JP); Junichi Aoyama, Kyoto (JP); Satoshi Ohashi, Kyoto (JP)

(73) Assignee: Horiba, Ltd., Kyoto (JP)

( * ) Notice: Subject to any disclaimer, the term of this patent is extended or adjusted under 35 U.S.C. 154(b) by 483 days.

(21) Appl. No.: 11/477,085

(22) Filed: Jun. 28, 2006

(65) Prior Publication Data

US 2007/0023655 A1 Feb. 1, 2007

(30) Foreign Application Priority Data

Jun. 29, 2005 (JP) .......................... P2005-189297
May 31, 2006 (JP) .......................... P2006-150952

(51) Int. Cl.
*G01N 23/00* (2006.01)
(52) U.S. Cl. ...................... 250/310; 250/306
(58) Field of Classification Search ....... 250/306–443.1
See application file for complete search history.

(56) References Cited

U.S. PATENT DOCUMENTS

| 3,845,305 | A |  | 10/1974 | Liebl |  |
|---|---|---|---|---|---|
| 4,900,932 | A | * | 2/1990 | Schafer et al. | 250/397 |
| 6,107,637 | A | * | 8/2000 | Watanabe et al. | 250/559.3 |
| 6,333,510 | B1 | * | 12/2001 | Watanabe et al. | 250/559.27 |
| 6,476,390 | B1 | * | 11/2002 | Murakoshi et al. | 850/9 |
| 6,753,518 | B2 | * | 6/2004 | Watanabe et al. | 250/201.3 |

(Continued)

FOREIGN PATENT DOCUMENTS

DE 207 994 3/1984

(Continued)

OTHER PUBLICATIONS

Carlsson, L. et al.; "An Efficient Apparatus for Studying Cathodoluminescence in the Scanning Electron Microscope"; Journal of Physics E. Scientific Instruments; IOP Publishing; Bristol, Great Britain, vol. 7, No. 2, Jan. 1, 1974, p. 98-100.

*Primary Examiner*—David A Vanore
*Assistant Examiner*—Andrew Smyth (57) ABSTRACT

An object of this invention is to make it easy to adjust a position of the energy beam to irradiate and a position of a focal point of a light collecting mirror part, and to prevent displacement of the light collecting part due to vibration with a simple arrangement. A sample measuring device in accordance with this invention is to measure light generated from a sample W by irradiating electron beams EB on the sample W, and comprises a electron optical column part 23 that converges the electron beams EB, and a light collecting mirror part 31 that is arranged between the electron optical column part 23 and the sample W and that has an energy beam path 312 to pass the electron beams EB converged by the electron optical column part 23 and to irradiate the electron beams EB on the sample W and a mirror face 311 whose focal point F is set on an axis of the energy beam path 312 and that collects the light L generated from the sample W by means of the mirror face 311, wherein the light collecting mirror part 31 is supported by the electron optical column part 23 so that the axis of the electron beams EB coincides with the focal point F.

5 Claims, 10 Drawing Sheets

U.S. PATENT DOCUMENTS

| | | |
|---|---|---|
| 6,885,445 B2* | 4/2005 | Bennett et al. ............... 356/301 |
| 6,919,577 B2* | 7/2005 | Watanabe et al. ........ 250/559.4 |
| 7,420,164 B2* | 9/2008 | Nakasuji et al. ............. 250/307 |
| 2002/0053634 A1* | 5/2002 | Watanabe et al. ........ 250/201.2 |
| 2003/0053048 A1 | 3/2003 | Bennett et al. |
| 2004/0217287 A1* | 11/2004 | Watanabe et al. ........... 250/310 |
| 2005/0263715 A1* | 12/2005 | Nakasuji et al. ....... 250/396 ML |

FOREIGN PATENT DOCUMENTS

JP     2003-157789     5/2003

* cited by examiner

SAMPLE MEASURING DEVICE

FIELD OF THE ART

This invention relates to a sample measuring device that measures light generated by irradiating energy beams on a sample.

BACKGROUND ART

There is a sample measuring device (an optical measuring device) of this kind that makes an evaluation on physicality in a minute area of a sample or an analysis on a semiconductor element by the use of light (cathode luminescence) generated from the sample by irradiating electron beams on the sample.

The sample measuring device has an arrangement, as shown in the patent document 1, wherein an image is formed on an optical fiber or an entrance slit of a spectroscope arranged outside of an electron microscope by arranging a light collecting mirror part to cover a sample in order to collect cathode luminescence. Since the light collecting mirror part covers the sample, a path to pass the electron beams is arranged in order to irradiate the electron beams on the sample. The light collecting mirror part has to be positioned in order to set an axis of the electron beams inside the path since the electron beams from the electron microscope pass the path of the light collecting mirror part in conducting a measurement. Furthermore, a position on which the electron beams are irradiated has to be positioned within the focal point of the light collecting mirror part.

However, conventionally the axis of the electron beams has to be set inside the path and a position adjusting mechanism to move and adjust the light collecting mirror part is necessary in order to set the position on which the electron beams are irradiated within the focal point, thereby to make the measuring device complicated and enlarged. In addition, if the position adjusting mechanism is used, there is a problem that it becomes very troublesome to move and adjust the position adjusting mechanism.

Especially, in case of using a high-resolution scanning electron microscope, since an area on which the electron beams are irradiated is a minute area less than 10 nanometer, it is very difficult to adjust a position of the area to locate within a focal point of the light collecting mirror part. It is not easy to adjust the position in spite of skilled technique.

In addition, with the conventional arrangement, since the electron optical column part and the light collecting mirror part of the high-resolution scanning electron microscope are not fixed each other, a relative position of the electron optical column part and the light collecting mirror part might be changed due to vibration and it often happens that the position on which the electron beams are irradiated are displaced from the focal point of the light collecting mirror part.

Furthermore, since the light collecting mirror part as being a body separated from the electron optical column part is arranged between the electron optical column part (electron optical column body) of the electron microscope and the sample, an objective lens locating inside the electron optical column part obviously locates above the light collecting mirror part, thereby to lengthen a distance between a distal end at a sample side of the objective lens and the sample (hereinafter called just as a working distance (WD)). As a result of this, there is a problem that a spatial resolution of the sample measuring device is deteriorated. Patent document 1: Japan patent laid open number 2003-157789

The present claimed invention intends to solve all of the above-mentioned problems at once. Primary expected objects of this invention are to make it easy to adjust the position on which the energy beams are irradiated within the focal point of the light collecting mirror part, to prevent the position of the light collecting mirror part from being displaced due to vibration and to lessen the working distance (WD) to the minimum.

DISCLOSURE OF THE INVENTION

In order to achieve the above-mentioned objects, the present claimed invention devices a following means. The sample measuring device in accordance with this invention is a sample measuring device that measures light generated from a sample by irradiating energy beams on the sample, and comprises an energy beam generating part that generates energy beams, a electron optical column part that has an energy beam control device to converge the energy beams generated by the energy beam generating part and that converges the energy beams so as to make an axis of the energy beam coincide with an axis of the energy beam control device by the use of the energy beam control device, and a light collecting mirror part that is arranged between the electron optical column part and the sample and that has an energy beam path to pass the energy beams converged by the electron optical column part and to irradiate the energy beams on the sample and a mirror face whose focal point is set on an axis of the energy beam path, and that collects the light generated from the sample by means of the mirror face, and is characterized by that the light collecting mirror part is supported by the electron optical column part so that the axis of the energy beams coincides with the focal point. The light generated from the sample is, for example, luminescence such as cathodoluminescence, photoluminescence, or electroluminescence.

In accordance with this arrangement, it is possible for the sample measuring device of a simple arrangement to adjust the position on which the energy beams are irradiated within the focal point of the light collecting mirror part and to prevent the position of the light collecting mirror part from being displaced due to vibration. In addition, the working distance (WD) can be lessened to the minimum.

In order to support the light collecting mirror part by the electron optical column part by combining mutually separated electron optical column part and light collecting mirror part, it is preferable to provide a positioning structure that makes it possible to mount and dismount the electron optical column part and the light collecting mirror part respectively, and that also makes the electron optical column part support the light collecting mirror part so as to conform the axis of the energy beams with the focal point by positioning an axial line of the energy beam control device and an axial line of the energy beam path coaxially.

As a concrete arrangement of the positioning structure, it is conceived that the positioning structure comprises a convex structure arranged at either one of the electron optical column part and the light collecting mirror part and a concave structure arranged at the other of them and corresponding to the convex structure.

In order to make it possible to simplify the arrangement of the positioning structure and to secure a function of positioning furthermore steadily, it is preferable that the positioning structure is formed at least on an upper face of the light collecting mirror part and comprises a tubular convex portion whose inner circumferential face specifies the energy beam path and an inner circumferential face of the electron optical column part that is formed to be the same as an outer circumferential face of the tubular convex portion.

Furthermore, the sample measuring device in accordance with this invention is a sample measuring device that measures light generated by irradiating energy beams on a sample, and comprises an energy beam generating part that generates energy beams, an objective lens that converges the energy beams generated by the energy beam generating part and that irradiates the energy beams on the sample, and a mirror face that collects the light generated from the sample on which the energy beams are irradiated, and is characterized by that at least a part of the objective lens is arranged closer to the sample than an energy beam incident end portion of the mirror face.

In accordance with this arrangement, it is possible to lessen the working distance (WD) to the minimum and to prevent a spatial resolution of the sample measuring device from being deteriorated, resulting in high accuracy measurement.

More concretely, it is preferable that the sample measuring device is provided with a electron optical column part having the objective lens and the mirror face, the electron optical column part has a electron optical column body and a light collecting mirror part supported by the electron optical column body, the electron optical column body comprises the objective lens, the light collecting mirror part comprises an energy beam path to pass the energy beams converged by the objective lens and to irradiate the energy beams on the sample, the mirror face whose focal point is set on an axis of the energy beam path, and a concave portion into which an end portion at a sample side of the electron optical column body fits, and at least a part of the objective lens is arranged closer to the sample than an energy beam incident end portion of the mirror face by inserting the end portion at the sample side of the electron optical column body into the concave portion. "The electron optical column body comprises the objective lens" means that the electron optical column body comprises all of the objective lens in case that the working distance is from a distal end at a sample side of the objective lens to the sample, and in case that the working distance is from a portion other than the distal end at the sample side of the objective lens to the sample, "the electron optical column body comprises the objective lens" means that the electron optical column body comprises at least a part of the objective lens including the portion other than the distal end at the sample side of the objective lens.

As another concrete embodiment to arrange at least a part of the objective lens closer to the sample than an energy beam incident end portion of the mirror face, it is conceived that the sample measuring device is provided with a electron optical column part having the objective lens and the mirror face, the electron optical column part has a electron optical column body and a light collecting mirror part supported by the electron optical column body, and at least one electrode constituting the objective lens is formed at the light collecting mirror part.

With this arrangement, it is preferable that the light collecting mirror part has an energy beam path to pass the energy beams generated by the energy beam generating part and to irradiate the energy beams on the sample, and at least one electrode constituting the objective lens is formed on an inner wall of the energy beam path.

In order to lessen the working distance to a large extend, it is preferable that the light collecting mirror part is the electrode constituting the objective lens.

As a concrete arrangement to make it easy to manufacture the light collecting mirror part, it is preferable that the light collecting mirror part is made of aluminum and functions as a grounded electrode of the objective lens. With this arrangement, since the light collecting mirror part also serves as the electrode constituting the objective lens, the working distance (WD) can be lessened to a large extent.

In addition, the sample measuring device in accordance with this invention is a sample measuring device that measures light generated by irradiating energy beams on a sample, and comprises a electron optical column part having an objective lens that converges the energy beams generated by an energy generating part and that irradiates the energy beams on the sample and a mirror face that collects the light generated from the sample, and is characterized by that an electrode constituting an objective lens and a mirror face that collects the light generated from the sample on which the energy beams are irradiated are provided at a distal end at a sample side of the electron optical column part.

As a concrete embodiment to lessen the working distance, it is preferable that a electron optical column has a electron optical column body and a light collecting mirror part supported by the electron optical column body, and at least one electrode constituting the objective lens is formed at the light collecting mirror part.

As a concrete embodiment to form the objective lens, it is conceived that the light collecting mirror part has an energy beam path to pass the energy beams generated by the energy beam generating part and to irradiate the energy beams on the sample, and at least one electrode constituting the objective lens is formed on an inner wall of the energy beam path.

In accordance with the present claimed invention, it is possible for the sample measuring device of a simple arrangement to adjust the position on which the energy beams are irradiated within the focal point of the light collecting mirror part, to prevent the position of the light collecting mirror part from being displaced due to vibration and to lessen the working distance (WD) to the minimum.

BEST MODES OF EMBODYING THE INVENTION

First Embodiment

A first embodiment of the present claimed invention will be explained with reference to drawings.

Figure 1:
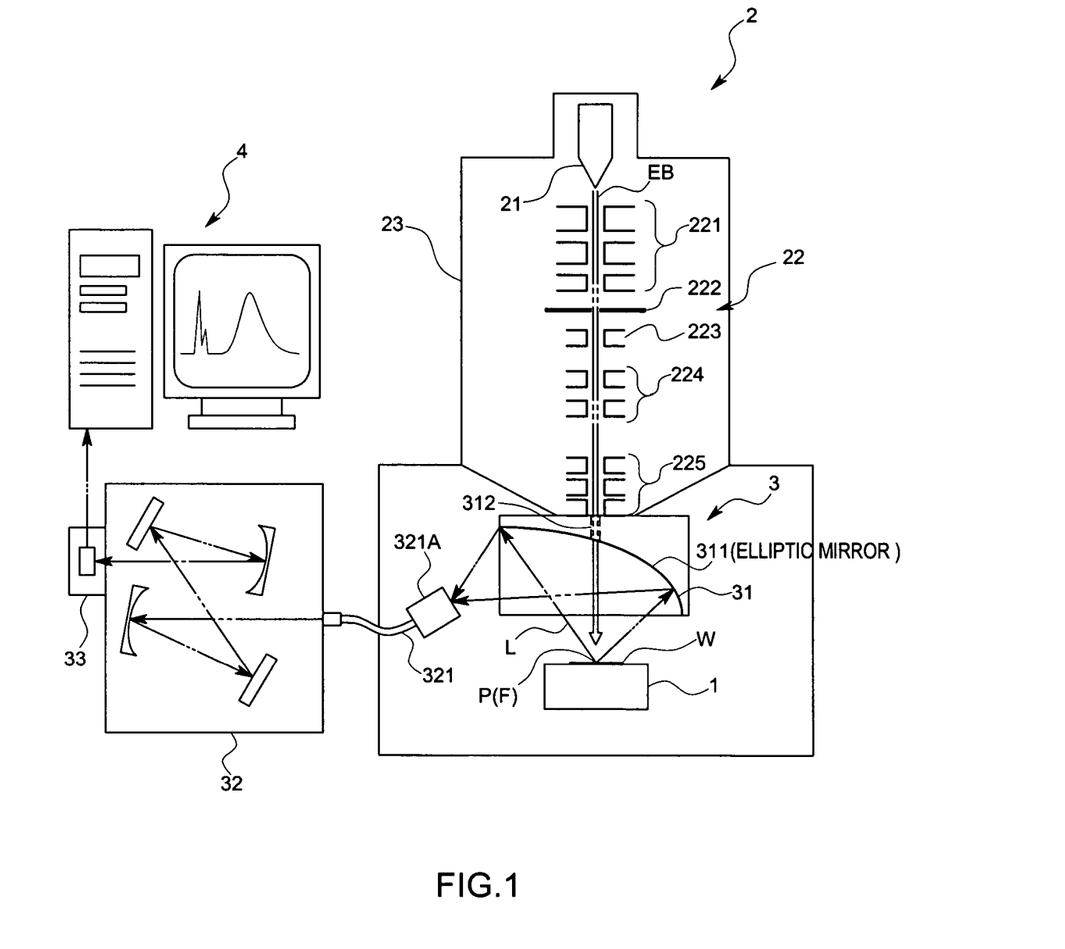
FIG. 1 is a pattern diagram of a structure showing a sample measuring device in accordance with a first embodiment of the present claimed invention.

A sample measuring device (hereinafter called as an electron beam measuring device) in accordance with this embodiment makes an evaluation on physicality in a minute area of a sample W or makes an analysis on a semiconductor element by the use of light L (cathode luminescence) generated from the sample W by irradiating electron beams EB as being energy beams on the sample W, and comprises as shown in FIG. 1, a sample stage 1, an electron beam irradiation device 2 that irradiates the electron beams EB as being the energy beams on the sample W placed on the sample stage 1, a sensing device 3 as being a light sensing part that divides and detects the luminescence L generated from the sample W due to irradiation of the electron beams EB, and an information processing unit 4 that receives an output signal from the sensing device 3 and that conducts a predetermined arithmetic computation in order to evaluate (for example, to measure a stress of) the sample W.

Each component 1 through 4 will be explained.

The sample stage 1 can be moved along directions of an x-axis, a y-axis and a z-axis, and in this embodiment the sample stage 1 is further provided with a cooling device and a temperature control mechanism, not shown in drawings, in order to decrease a peak half width of a sample spectrum and to obtain meaningful information from the sample spectrum so that the sample stage 1 and the sample W can be cooled at a predetermined temperature of less than or equal to several dozen K.

The electron beam irradiation device 2 is, for example of a scanning type, and comprises an electron gun 21 as being an energy beam generating part, an energy beam control device 22 composed of a lens mechanism to converge the electron beams EB irradiated on a measured portion of the sample W from the electron gun 21 and a scanning mechanism to scan the electron beams EB, and a electron optical column part 23 that accommodates the electron gun 21 and the energy beam control device 22. The energy beam control device 22 comprises a gun lens 221 to draw electrons from the electron gun 21, an electrode for aperture 222 to monitor an electron dose, a stigmator 223 to correct a stigma of the electron beams EB, a deflector 224 to deflect the electron beams EB, and an objective lens 225 as being of an electrostatic type to converge the electron beams EB in this order from an upper part of the electron optical column part 23. The electron optical column part 23 has an energy beam irradiation opening 231 to irradiate the electron beams EB on the sample W from the electron gun 21 (refer to FIG. 2), and the energy beam irradiation opening 231 opens along an axis O of the electron beams EB as being the energy beams. In this embodiment, the electron gun 21 is of a thermal filament electric field open type.

The sensing device 3 comprises a light collecting mirror part 31, a spectroscopic part 32, and a sensing part 33.

The light collecting part mirror 31 is arranged between the electron optical column part 23 and the sample W, and collects the luminescence L generated from the sample W with the least loss and introduces it to the spectroscopic part 32. The light collecting mirror part 31 has an energy beam path 312 to pass the electron beams EB converged by the electron optical column part 23 and irradiate the electron beams EB on the sample W, and a mirror face 311 whose focus F is set on an axis line of the path 312. If the light collecting mirror 31 is made of an electromagnetic shield material such as a Permalloy, iron, or silicon plate, the light collecting mirror part 31 including the energy beam path 312 can be shielded electromagnetically.

The mirror face 311 may be a paraboloid mirror or an elliptic mirror, and in this embodiment the elliptic mirror is used as the mirror face 311. The elliptic face mirror 311 acts as receiving and collecting light by itself and has an advantage that the focal point F can be set freely because of the elliptic face. Meanwhile, since an imaging magnification of the elliptic mirror 311 is determined by a mechanical layout condition, there is a problem that coupling with the spectroscopic part 32 does not go smoothly. In order to solve this problem and to simplify adjustment of the optical axis, an optical fiber 321 is used and the luminescence L collected by the elliptic mirror 311 is transmitted to the spectroscopic part 32. The adjustment of the optical axis is conducted to adjust an optical incidence part 321A of the optical fiber 321 in conformity to the focal point F of the elliptic face mirror 311 by the use of an adjusting mechanism, not shown in drawings.

Figure 2:
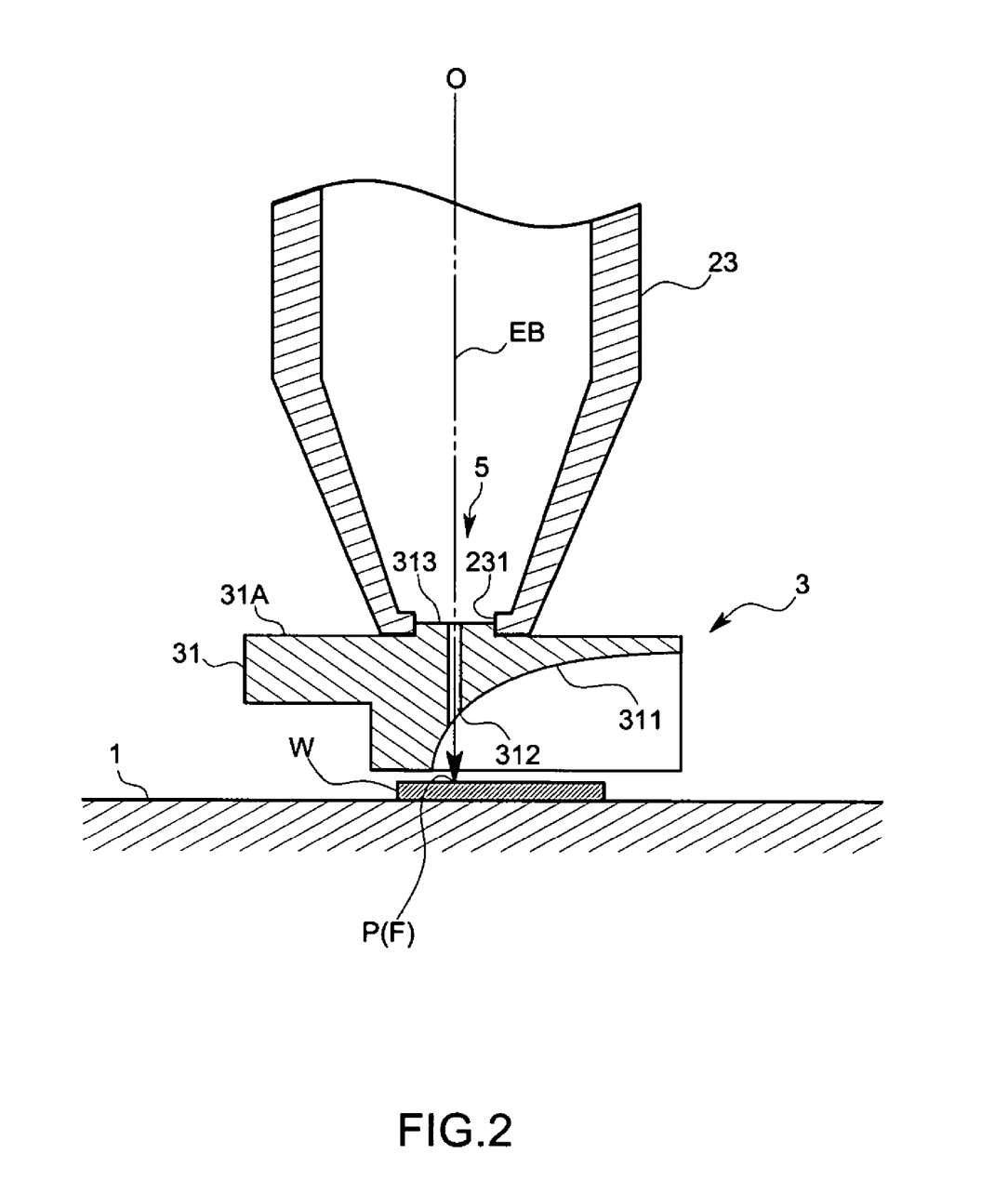
FIG. 2 is a partial magnified cross-sectional diagram of a electron optical column part and a light collecting mirror part in accordance with the embodiment.

The energy beam path 312 is, as shown in FIG. 2, to irradiate electron beams EB irradiated from the energy beam irradiation opening 231 on the sample W, and the electron beams EB passing the energy beam path 312 are irradiated on the sample W. The energy beam path 312 is defined by an inner peripheral face of a tubular convex portion 313 so that an irradiation position P where the electron beams EB after passing the energy beam path 312 are irradiated on the sample W falls on within the focal point F of the light collecting mirror part 31.

The spectroscopic part 32 divides the luminescence L collected by the light collecting mirror part 31 into monochromatic light and is composed of, for example, a monochrometor.

The sensing part 33 measures luminous intensity of each monochromatic light divided into each of multiple wavelengths by the spectroscopic part 32 and outputs an output signal having an electric current value (or a voltage) corresponding to the intensity of each monochromatic light. In this embodiment, the sensing part 33 is composed of a photomultiplier (PMT), however, it may be changed in conformity to the wavelength region to be measured. For example, it is preferable to use a Ge sensor, a Pbs sensor, an infrared photomultiplier or the like for the infrared region (1 µm~). In addition, a CCD may be used because it is superior in photoelectron conversion efficiency, a dynamic range and an S/N ratio. It is possible for the CCD to detect the spectrum collectively.

The information processing unit 4 is a multipurpose or a dedicated purpose computer comprising a CPU, a memory, an input/output interface, an AD converter and an input device. The information processing unit 4 receives an output signal from the sensing device 3 and calculates a stress at each scanned and measured point by operating the CPU or its peripheral devices based on a program stored in a predetermined area of the memory.

Figure 3:
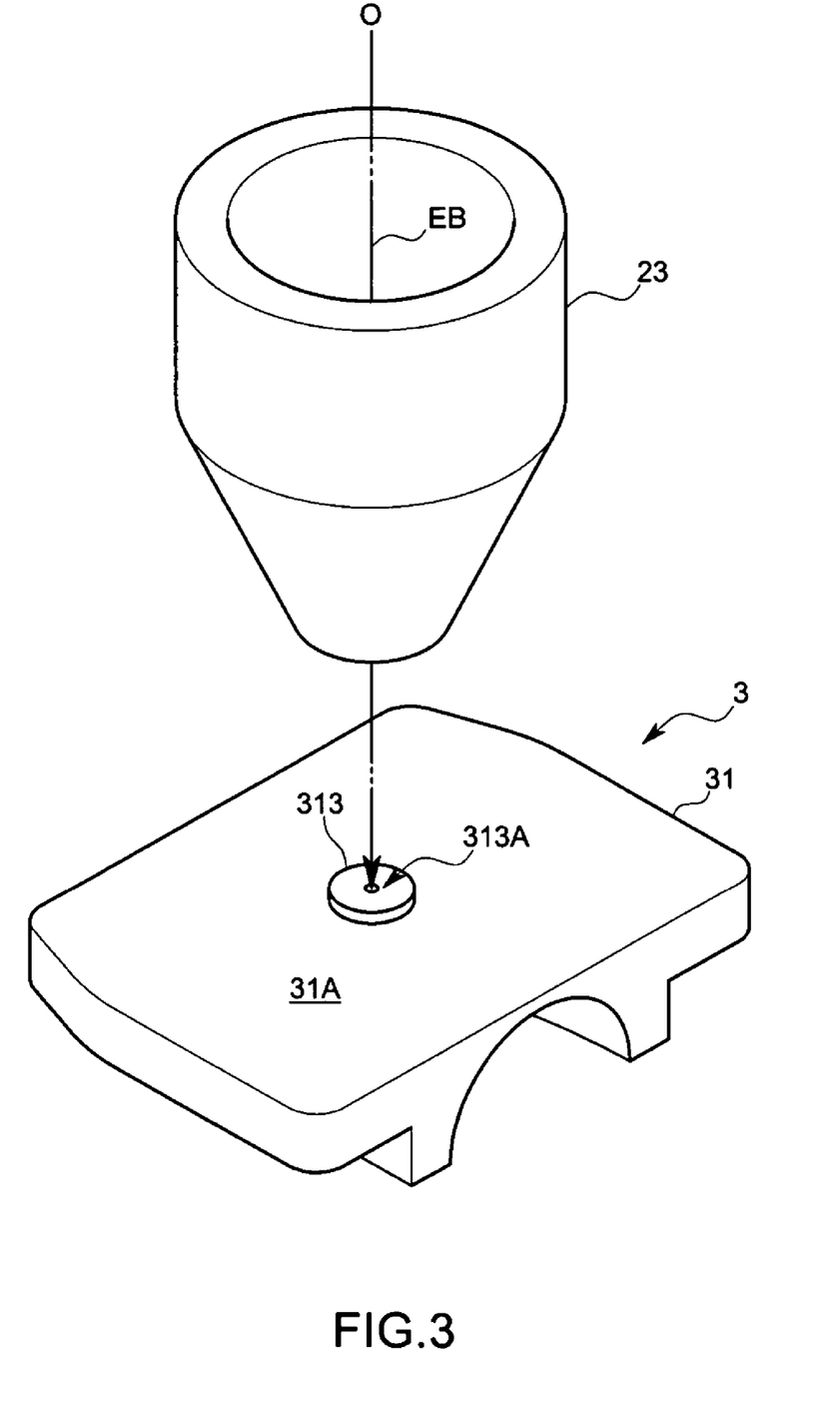
FIG. 3 is a diagram to assemble the electron optical column part and the light collecting mirror part in accordance with the embodiment.

A concrete method for calculating the stress is to receive the light intensity signal from the sensing device 3 and produce a spectrum data as being a data showing a spectral waveform and to conduct smoothing on the spectral waveform shown by the spectrum data. Next, give a differential operation on the waveform obtained by smoothing and the wavelength at a time when the obtained value is inverted from plus to minus is made to be a peak wavelength. The peak wavelength may be obtained by a fitting process with a predetermined function. Then the stress applied to the sample W is calculated based on an amount of displacement between the peak wavelength obtained from the sample W as being the object to be embodiment, as shown in FIG. 2 and FIG. 3, the light collecting mirror part 31 is supported in an integrated manner by the electron optical column part 23 with the axis O of the electron beams EB coincided with the focal point F so that a relative position of the electron optical column part 23 and the light collecting mirror part 31 becomes constant. In this embodiment, since the electron optical column part 23 and the light collecting mirror part 31 are separated, a positioning structure 5 is provided in order to arrange the electron optical column part 23 and the light collecting mirror part 31 in an integrated manner.

The positioning structure 5 makes it possible to mount and dismount the electron optical column part 23 and the light collecting mirror part 31 respectively, and also makes the electron optical column part 23 support the light collecting mirror part 31 so as to conform the axis O of the electron beams EB with the focal point F by positioning an axial line of the energy beam control device 22 and an axial line of the energy beam path 312 coaxially. The positioning structure 5 comprises a convex structure arranged at either one of the electron optical column part 23 and the light collecting mirror part 31 and a concave structure arranged at the other of them and corresponding to the convex structure, and more concretely comprises a tubular convex portion 313 that is formed on an upper face 31A of the light collecting mirror part 31 and whose inner circumferential face specifies the energy beam path 312 and an inner circumferential face of the energy beam irradiation opening 231 of the electron optical column part 23 that is formed to be the same as an outer circumferential face of the tubular convex portion 313. The electron optical column part 23 and the light collecting mirror measured and the peak wavelength as being the reference.

A principle of calculating the stress will be explained briefly. A relationship between the stress existing at a portion of the sample W on which the electron beams EB are irradiated and the obtained peak wavelength can be approximated collinearly until the stress is less than a dozen GPa and its correlation can be shown by the following expression (1).

$$\nu_\sigma = \nu_0 + \Pi \cdot \sigma \quad (1)$$

Where, $\nu_\sigma$ is a peak wavelength of the measured spectrum, $\nu_0$ is a peak wavelength as being the reference, $\sigma$ is a tensor showing a stress applied to the sample W, and $\Pi$ is a tensor that is called as the PS (Piezo-Spectroscopic) coefficient and that depends on the stress only and does not depend on a position. $\nu_0$ and $\Pi$ are stored as a correlation data in a storing part of the memory. The correlation data is obtained statistically by applying multiple stresses that have been known to a sample equivalent to the sample W.

For example, in case of measuring a residual stress of the sample W, the peak wavelength as being the reference is specified by a fluorescence spectrum wavelength obtained from an equivalent sample where no residual stress exists or a portion of the sample W where no residual stress exists. Meanwhile, in case of measuring an internal stress generating due to an external force applied to the sample W, the peak wavelength as being the reference is specified by the use of the fluorescence spectrum wavelength obtained from the sample W in a state no external force is applied. The data showing the reference peak wavelength is stored in, for example, a storing part set in a predetermined area of the memory.

Then in the electron beam measuring device of this part 31 are continuously and integrally formed by fittingly inserting the tubular convex portion 313 into the inner circumferential face of the energy beam irradiation opening 231 (the objective lens 224 formed at the lower end of the electron optical column part 23 in this embodiment).

The tubular convex portion 313 is of a cylindrical shape whose external diameter is generally the same as the inside diameter of the energy beam irradiation opening 231 and is arranged on the upper face 31A of the light collecting mirror part 31. In addition, the energy beam path 312 passes a central axis of the tubular convex portion 313 and the energy beam path 312 opens at an upper face center part 313A (refer to FIG. 3) of the tubular convex portion 313. The energy beam irradiation opening 231 and the energy beam path 312 are continuously formed by fittingly inserting the tubular convex portion 313 into the energy beam irradiation opening 231.

With the arrangement of the electron beam measuring device, since the light collecting mirror part 31 is supported by the electron optical column part 23, there is no need of adjusting a position of the light collecting mirror part 31 every time measurement is conducted. As a result, it is possible to adjust a position of the irradiation position P of the electron beams EB within the focal point F of the light collecting mirror part 31 easily and to prevent displacement of the light collecting mirror part 31 due to vibration. Accordingly, since the irradiation position P of the electron beams EB always falls within the focal point F, it is possible to efficiently collect all of the light L generated at the irradiation position P by excitation, thereby to prevent decline of the detected signal to the minimum.

In addition, since the positioning structure 5 is so arranged to comprise the energy beam irradiation opening 231 and the tubular convex portion 313, and the energy beam irradiation opening 231 and the tubular convex portion 313 are continuously and integrally formed by fittingly inserting the tubular convex portion 313 into the energy beam irradiation opening 231, positioning and integration of the tubular convex portion 313 and the energy beam irradiation opening 231 can be conducted simultaneously, thereby to save the trouble of positioning.

Second Embodiment

Next, a second embodiment in accordance with this invention will be explained with reference to drawings. An identical code is given to a component corresponding to the first embodiment.

Figure 4:
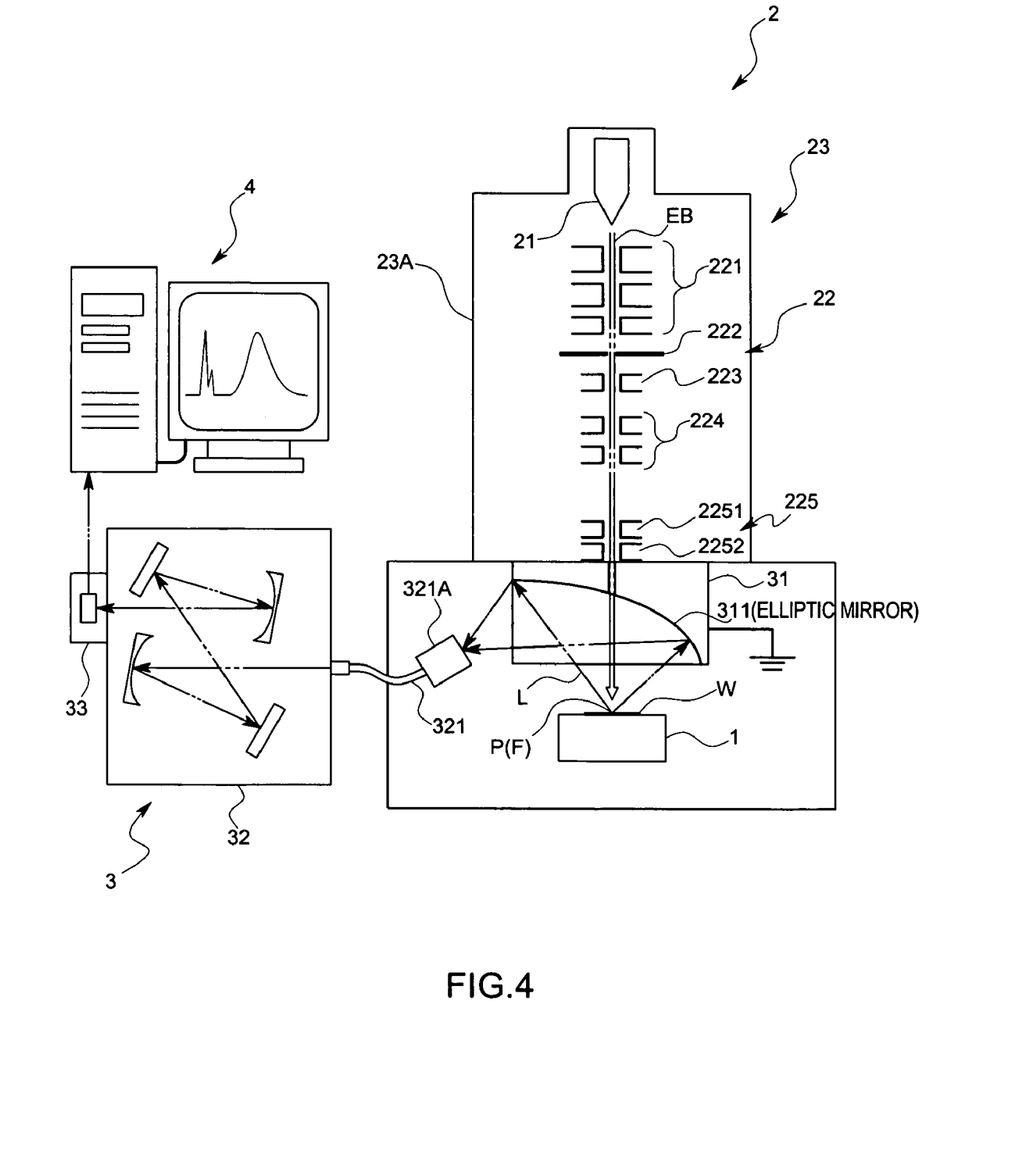
FIG. 4 is a pattern diagram of a structure showing a sample measuring device in accordance with a second embodiment of the present claimed invention.

As shown in FIG. 4, a sample measuring device in accordance with this embodiment is different from the first embodiment in arrangements of the sensing device 3 and the electron beam irradiation device 2.

More specifically, the sensing device 3 in the first embodiment comprises the light collecting mirror part 31, however, in this embodiment a electron optical column part 23 of the electron beam irradiation device 2 has the light collecting mirror part 31.

The electron beam irradiation device 2 in accordance with this embodiment is, for example, of a scanning type and comprises, an electron gun 21 as being an energy beam generating part, an energy beam control device 22 comprising a lens mechanism to converge the electron beams EB irradiated from the electron gun 21 on a measured portion of a sample W and a scanning mechanism to scan the electron beams EB, a mirror face 311 to pass and irradiate the electron beams EB and to collect the light L generated from the sample W, and a electron optical column part 23 to hold the electron gun 21, the energy beam control device 22 and the mirror face 311. In this embodiment, the electron gun 21 is of a thermal field emission type.

Figure 5:
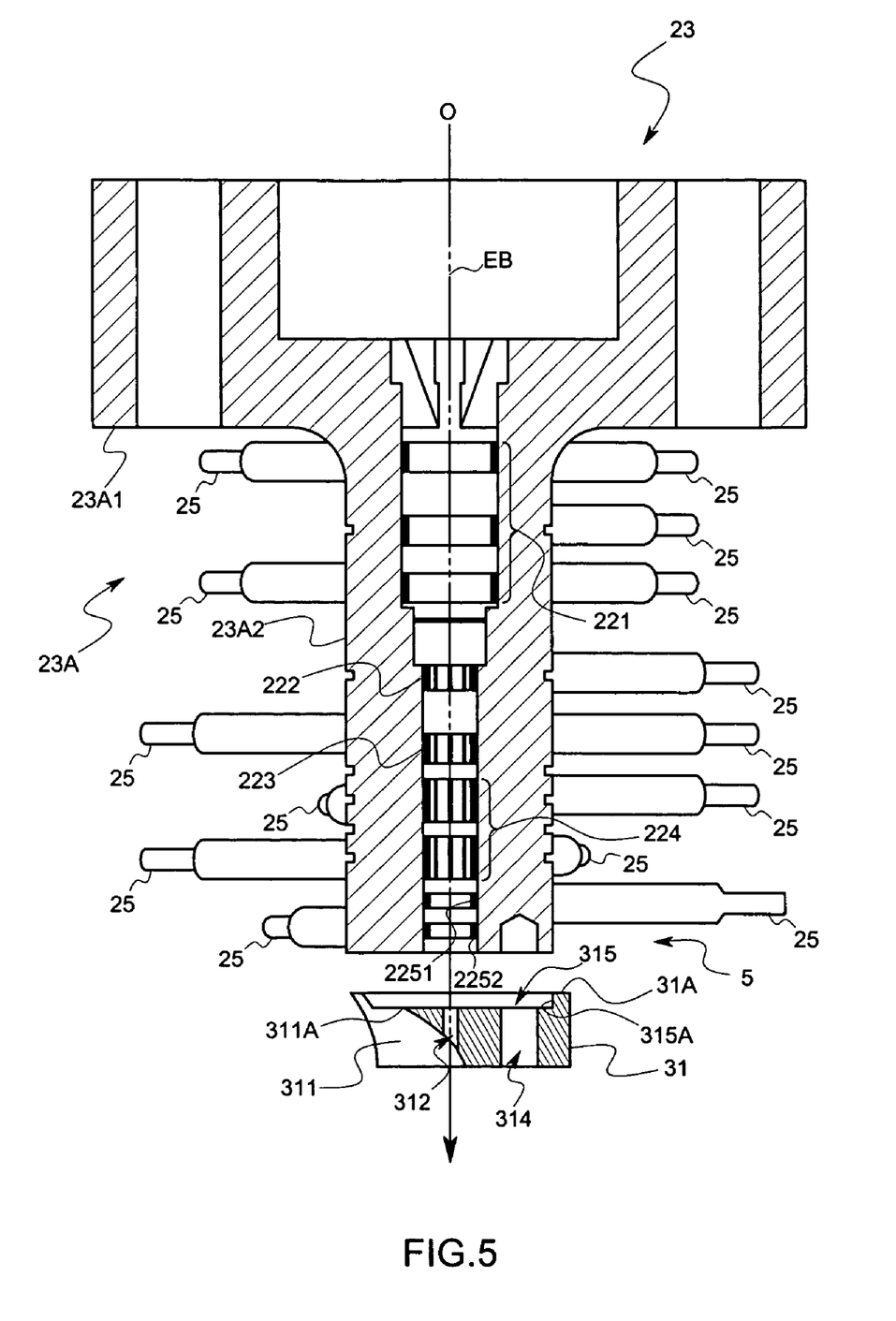
FIG. 5 is a magnified cross-sectional diagram mainly showing a electron optical column body and a light collecting mirror part in accordance with the embodiment.
Figure 6:
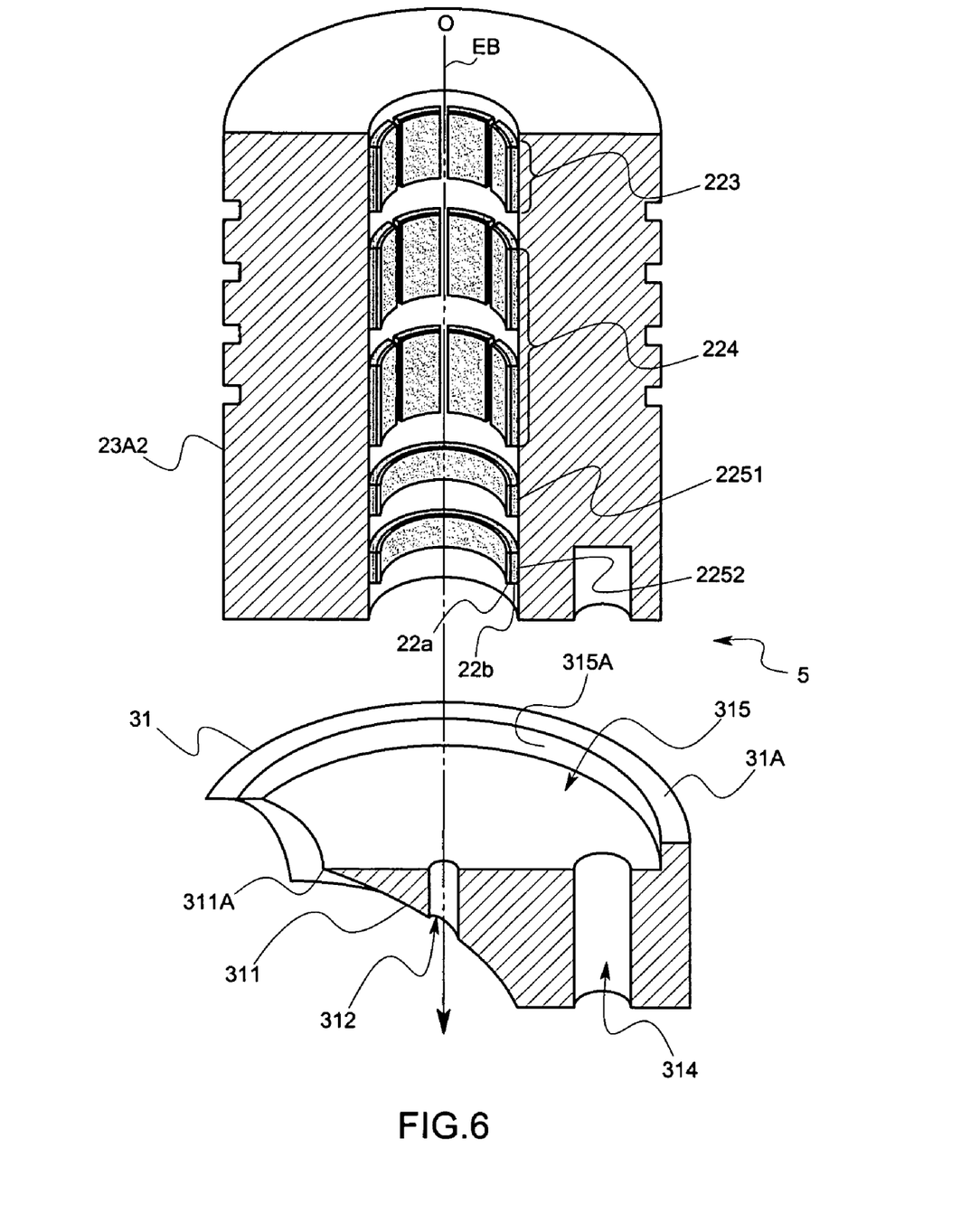
FIG. 6 is a partial magnified cross-sectional diagram of the electron optical column body and the light collecting mirror part in accordance with the embodiment.

More specifically, the electron optical column part 23 comprises, as shown in FIG. 5 and FIG. 6, a electron optical column body 23A and a light collecting mirror part 31 supported by the electron optical column body 23A.

The electron optical column body 23A is a tubular ceramics column having high resistivity electrically conductivity, and comprises a flange portion 23A1 inside of which the electron gun 21 is arranged, and a cylindrical portion 23A2 elongating downward out of the flange portion 23A1.

The energy beam control device 22 is arranged on an inner wall (an inner circumference) of the cylindrical portion 23A2. More specifically, a gun lens 221 to draw electrons from the electron gun 21, an electrode for aperture 222 to monitor an electron dose, a stigmator 223 to correct a stigma of the electron beams EB, and a deflector 224 to deflect the electron beams EB are arranged in this order from above on the inner wall of the cylindrical portion 23A2, and two electrodes 2251, 2252 of a ring shape constituting a part of an objective lens 225 as being a lens of an electrostatic type to converge the electron beams EB are formed on a downside of the deflector 224.

The gun lens 221 is an electrode of a triode type, and each of the electrode for aperture 222, the stigmator 223 and the deflector 224 is provided with eight pieces of electrode chips arranged along each circumferential direction. In addition, a predetermined voltage is applied to each of the electrodes and the electrode chips by a power supply, not shown in drawings, arranged outside through a wiring 25 or each of the electrodes and the electrode chips is grounded. The wiring 25 is connected to each of the electrodes and the electrode chips by passing through inside the cylindrical portion 23A2. The wiring 25 is omitted to draw in FIG. 6.

The two electrodes 2251, 2252 constituting the objective lens 225 and the light collecting mirror part 31 constitute an electrode of a triode type by mounting the light collecting mirror part 31 on the electron optical column body 23A. Each of the two electrodes 2251, 2252 is of a ring-shaped electrode with a thin thickness, and 0V (a grounding wire) is connected to the upper electrode 2251 and an appropriate high voltage (a voltage that can produce a necessary lens) is applied to the lower electrode 2252. A method for manufacturing the electrodes 2251, 2252 is to provide the inner wall of the cylindrical portion 23A2 with a ceramic metallization treatment, to form a nickel layer 22a and to form a gold layer 22b above the nickel layer 22a. The electrode and the electrode chip constituting the gun lens 221, the electrode for aperture 222, the stigmator 223 and the deflector 224 are also manufactured by the same method.

The light collecting mirror part 31 is arranged between the electron optical column body 23A and the sample W, and is to collect the luminescence L generated from the sample W with the minimum loss and to guide it to a spectroscopic part 32 to be described later. The light collecting mirror part 31 comprises an energy beam path 312 to path the electron beams EB converged by the electron optical column body 23A and to irradiate the electron beams EB on the sample W, and a mirror face 311 whose focal point F is set on an axial line of the energy beam path 312. Furthermore, the light collecting mirror part 31 has multiple (three in this embodiment) openings 314 to be fixed to the electron optical column body 23A by fastening with bolts.

In addition, the light collecting mirror part 31 is made of aluminum. If the light collecting mirror part 31 is made of ceramics, the light L scatters due to power clusters generated at a time when the mirror face 331 is cut. In this respect, since the light collecting mirror part 31 is made of aluminum in this embodiment, there is no power cluster generating on the mirror face 311. In addition, the grounded light collecting mirror part 31 and the two electrodes 2251, 2252 constituting the objective lens 225 constitute the objective lens 225 of the triode type. Due to this arrangement, the lowest end (the distal end at the sample side) of the object lens 225 becomes an outlet at a sample side of the energy beam path 312. More specifically, a height from the sample W to at least a part (the electrode at the most sample side among the electrodes constituting the objective lens 225 in this embodiment) of the objective lens 225 is set to be lower than a height from the sample W to an energy beam incident end portion 311A (the upper end portion of the mirror face 311) of the mirror face 311. In this embodiment the mirror face 311 is a concave ellipsoidal mirror.

The energy beam path 312 is, as shown in FIG. 3, to irradiate the electron beams EB ejected from the electron optical column body 23A on the sample W and the electron beams EB passing the energy beam path 312 are irradiated on the sample W. In addition, the energy beam path 312 is so formed that an irradiation point P on which the passed electron beams EB are irradiated locates within the focal point F of the light collecting mirror part 31.

The electron beam measuring device in accordance with this embodiment has an arrangement that the electron optical column body 23A is integrally formed with the light collecting mirror part 31 with the light collecting mirror part 31 supported by the electron optical column body 23A so that an axis O of the electron beams EB coincides with the focal point F and a relative position between the electron optical column body 23A and the light collecting mirror part 31 is kept constant. In this embodiment, since the electron optical column body 23A and the light collecting mirror part 31 can be separated each other, a positioning structure 5 is provided in order to integrally form the electron optical column body 23A and the light collecting mirror part 31.

The positioning structure 5 makes it possible to mount and dismount the electron optical column body 23A and the light collecting mirror part 31 respectively, and also makes the electron optical column body 23A support the light collecting mirror part 31 so that the axis O of the electron beams EB coincides with the focal point F by positioning an axial line of the energy beam control device 22 and an axial line of the energy beam path 312 coaxially.

The positioning structure 5 comprises a convex structure arranged at either one of the electron optical column body 23A and the light collecting mirror part 31 and a concave structure arranged at the other of them and corresponding to the convex structure, more specifically comprises a concave portion 315 that is formed on the upper face 31A of the light collecting mirror part 31 and into which a lower end portion of the electron optical column body 23A is inserted, and an outer circumferential face of the lowest end portion of the electron optical column body 23A that is formed generally the same as an inner circumferential face 315A of the concave portion 315. The outer circumferential face of the lowest end portion of the electron optical column body 23A is fittingly inserted into the concave portion 315 so as to be mounted on the concave portion 315 and the light collecting mirror part 31 is fixed to the electron optical column body 23A by fastening with multiple (three in this embodiment) bolts.

An inside diameter of the concave portion 315 is generally the same as an outer diameter of the outer circumferential face of the lowest end portion of the cylindrical portion 23A2 of the electron optical column body 23A and a depth of the concave portion 315 can be set arbitrarily. If a tolerance between the outside diameter of the cylindrical portion 23A2 and the inside diameter of the concave portion 315 is specified, a concentric degree between the axial line of the energy beam control device 22 and the axial line of the energy beam path 312 is properly obtained just by fittingly inserting the cylindrical portion 23A2 into the concave portion 315 and arranging the lower end portion of the electron optical column body 23A inside the concave portion 315 so that the axis O of the electron beam EB and the focal point F are conformed.

With the sample measuring device in accordance with the above-mentioned arrangement, even if the electrode 2252 of the objective lens 225 to which a high voltage is applied is set as the reference, the working distance (WD) can be lessened to the minimum. As a result, it is possible to prevent a spatial resolution of the sample measuring device from being deteriorated, resulting in high accuracy measurement. In addition, since the light collecting mirror part 31 is supported by the electron optical column body 23A, there is no need of adjusting a position of the light condensing mirror part 31 every time measurement is conducted. As a result, it is possible to adjust a position of the irradiation position P of the electron beams EB within the focal point F of the light collecting mirror part 31 easily and to prevent displacement of the light collecting mirror part 31 due to vibration. Accordingly, since the irradiation position P of the electron beams EB always falls within the focal point F, it is possible to efficiently collect all of the light L excited at the irradiation position P, thereby to prevent decline of the detected signal to the minimum.

It is especially effective for the electron beam irradiation device 2 with a low accelerating voltage of less than or equal to 5 kV or a super low accelerating voltage of less than or equal to 1 kV that is relatively susceptible to a disturbance effect.

In addition, since the positioning structure 5 comprises the concave portion 315 and the lower end portion of the electron optical column body 23A and the concave portion 315 and the electron optical column body 23A can be continuously and integrally formed by inserting the lower end portion of the electron optical column body 23A into the concave portion 315, it is possible to conduct integration and positioning at once, thereby to omit a process of positioning.

The present claimed invention is not limited to the above-mentioned embodiment.

Figure 7:
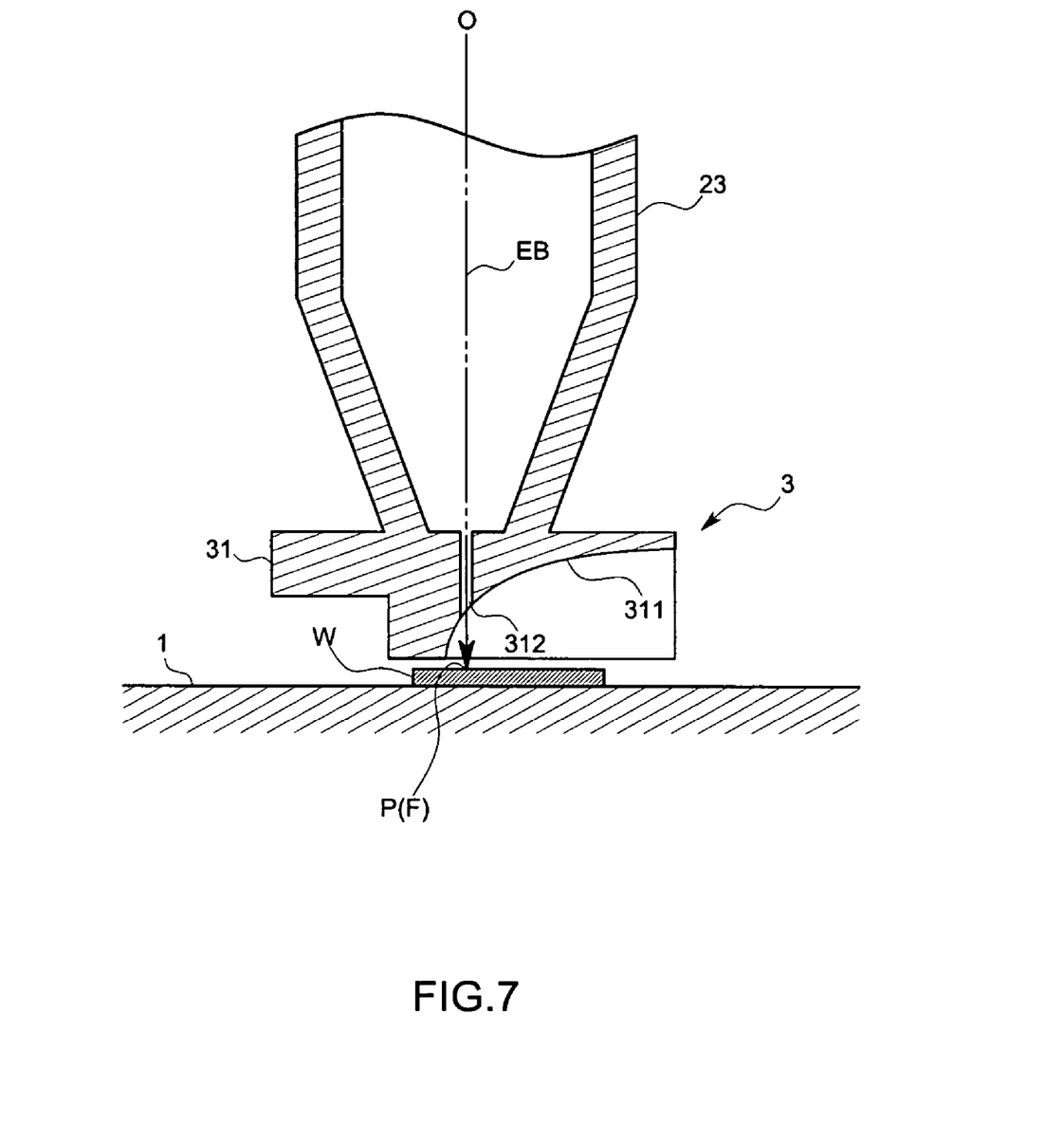
FIG. 7 is a partial magnified cross-sectional diagram of a electron optical column part and a light collecting mirror part in accordance with other embodiment.

For example, in the above-mentioned embodiment, mutually separated electron optical column part and light collecting mirror part are continuously and integrally formed, however, a electron optical column part and a light collecting mirror part may be integrally formed as shown in FIG. 7. In accordance with this arrangement, there is no need of adjusting a position of the light collecting mirror part and displacement of the light collecting mirror part due to vibration can be prevented.

In addition, in the above-mentioned first embodiment the positioning structure comprises the energy beam irradiation opening and the tubular convex portion, however, it is not limited to this as long as the light collecting mirror part is directly or indirectly supported by the electron optical column part. As one of the methods, a connecting member may be provided in addition to the electron optical column part and the light collecting mirror part and the electron optical column part and the light collecting mirror part are connected by the use of the connecting member.

Figure 8:
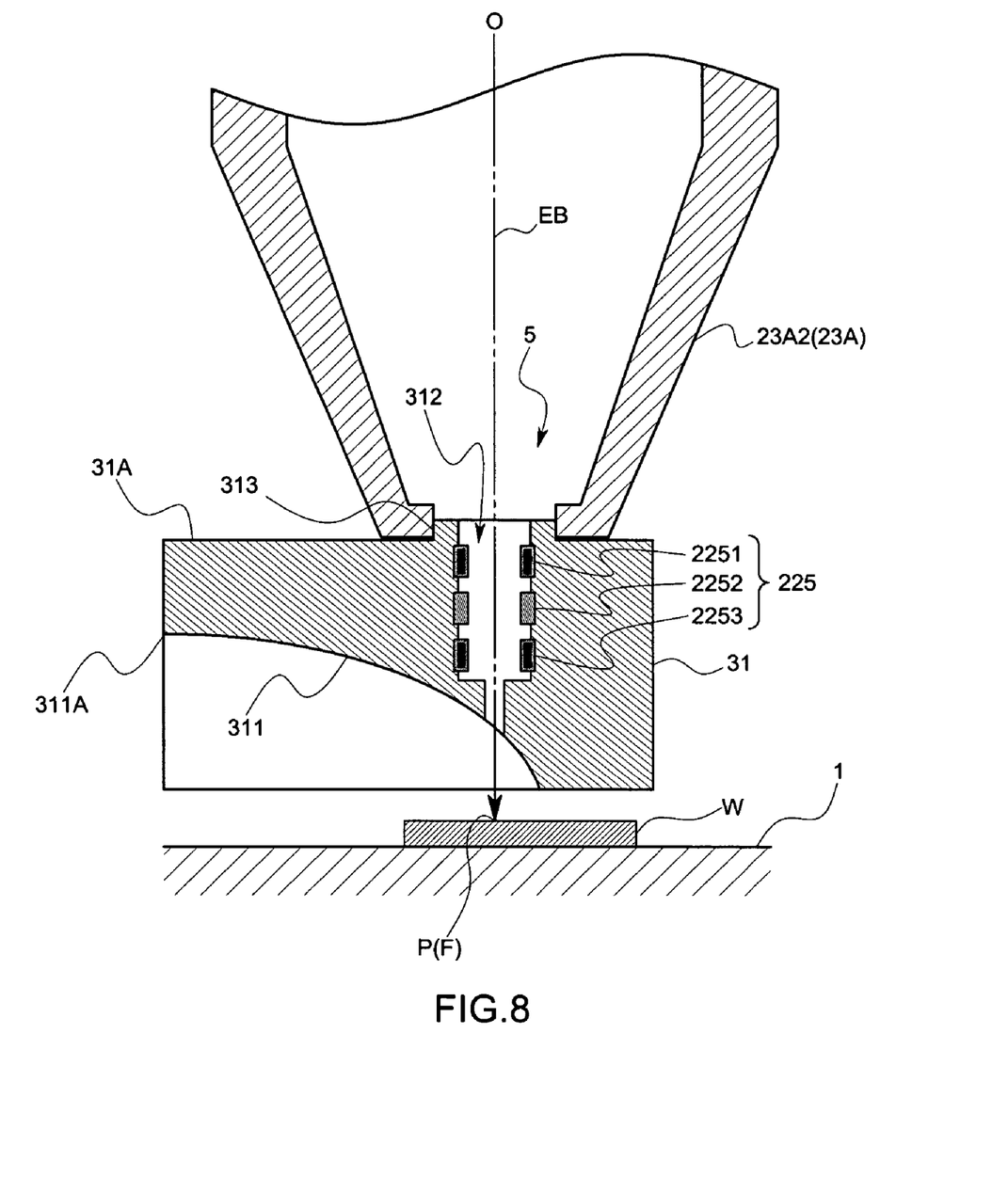
FIG. 8 is a partial magnified cross-sectional diagram showing a electron optical column body, a light collecting mirror part and an objective lens in accordance with other embodiment.

For example, with regard to an arrangement wherein at least a part of the objective lens 225 is arranged closer to the sample W than an energy beam incident end portion of the mirror face 311, it may have an arrangement wherein a height from the sample W to at least a part of the objective lens 225 is set to be lower than a height from the sample W to the energy beam incident end portion 311A of the mirror face 311 by arranging the objective lens 225 on the inner wall (the inner circumference) of the energy beam path 312 of the light collecting mirror part 31, for example as shown in FIG. 8. With this arrangement, the light collecting mirror part 31 is made of ceramics in order to prevent forming of clusters as much as possible and the mirror face 311 is formed with a process of evaporating metal, and the electrostatic lens 225 is formed by manufacturing the electrodes 2251, 2252, 2253 by providing the inner wall of the energy beam path 312 with a ceramic metallization process.

Figure 9:
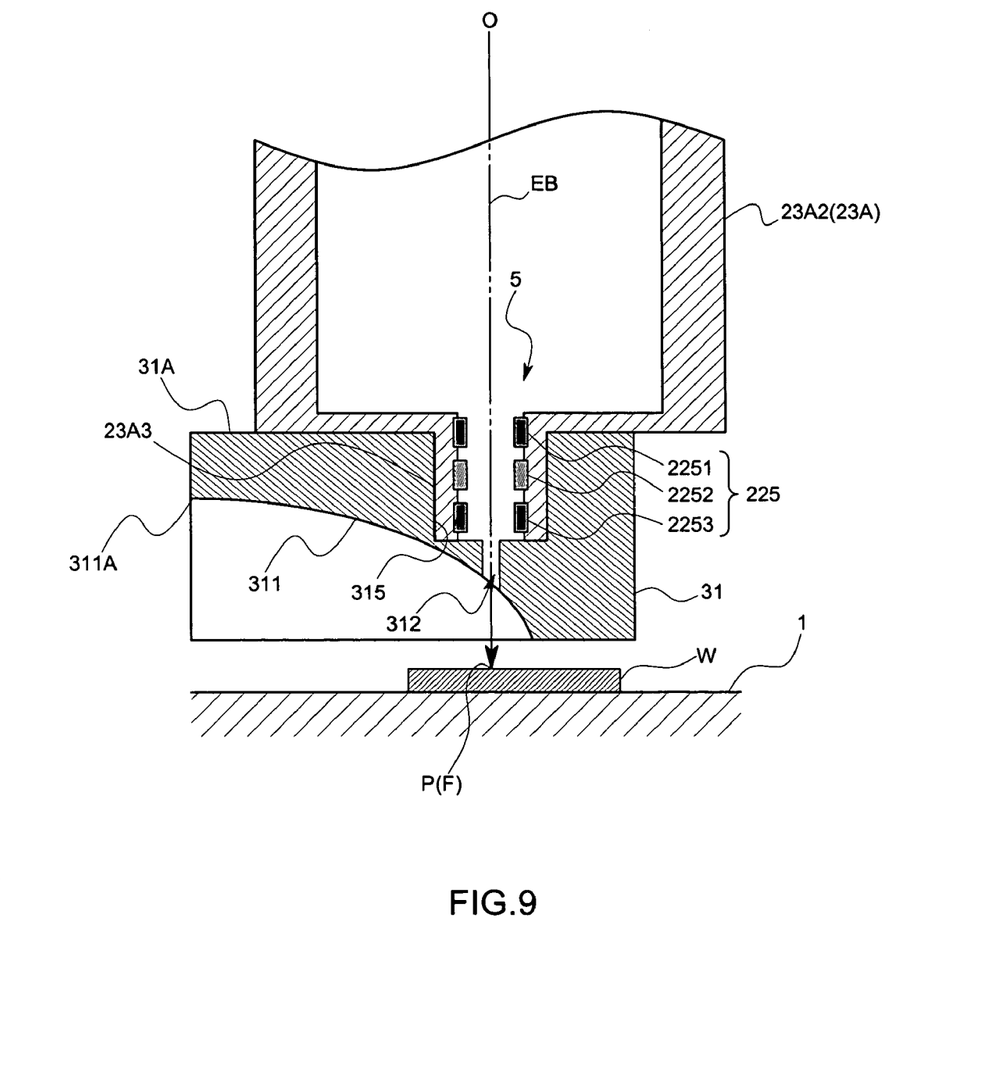
FIG. 9 is a partial magnified cross-sectional diagram showing a electron optical column body, a light collecting mirror part and an objective lens in accordance with further different embodiment.

In addition, as shown in FIG. 9, a height from the sample W to at least a part of the objective lens 225 may be set to be lower than a height from the sample W to the energy beam incident end portion 311A of the mirror face 311 by arranging a tubular convex portion 23A3 on an inner wall of which the objective lens 225 is formed at the lower end of the cylindrical portion 23A2 of the electron optical column body 23A and by mounting the tubular convex portion 23A3 on the concave portion 315 arranged on the upper face 31A of the light collecting mirror part 31.

Figure 10:
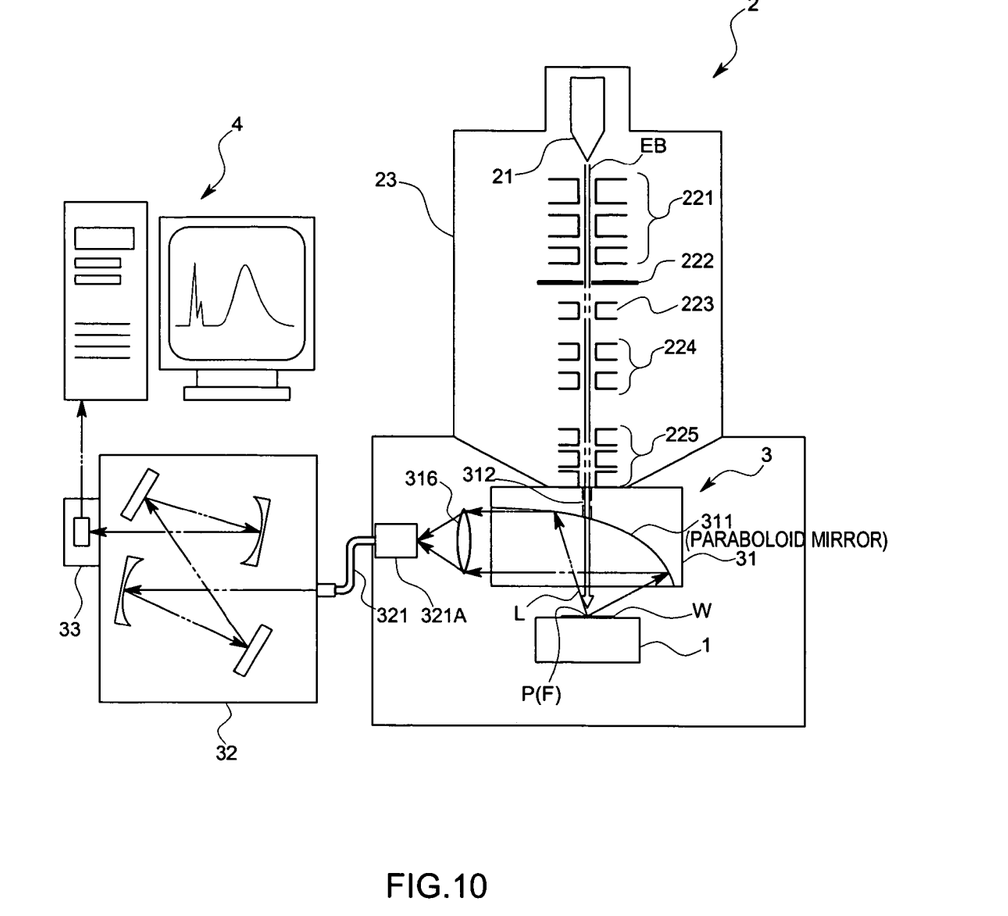
FIG. 10 is a pattern diagram of a structure showing a sample measuring device in accordance with further different embodiment.

Furthermore, in the above-mentioned embodiments the elliptic mirror is used as the light collecting mirror part, however, it is not limited to this and, for example, a paraboloid mirror may be used. In this case, if the light L from the sample W reflects on the paraboloid mirror, the light L becomes parallel light due to characteristics of the paraboloid mirror. Then in order to collect the parallel light on the optical incidence part 321A of the optical fiber 321, a convex lens 316 is arranged between the light condensing mirror part 31 and the optical fiber 321 as shown in FIG. 10.

In addition, the energy beam path arranged on the light collecting mirror part in the above-mentioned embodiment may be used as an aperture for differential pumping. In other words, in case of measuring a living sample, it is necessary to pump out air inside the electron optical column part so as to be in high vacuum and to pump out air inside a chamber where the light collecting mirror part and the sample stage are arranged so as to be in low vacuum as well. In this case, the energy beam path may serve a function as an aperture to pump out air with keeping a difference of pressure between the electron optical column part and the chamber.

Furthermore, in case of a composite device for making a cathode luminescence (CL) measurement and raman spectroscopy or photoluminescence (PL) measurement, the mirror face of the light collecting mirror part may be used for irradiating laser beam.

In addition, the measurement by the use of the cathode luminescence (CL) is not limited to a stress measurement, and can conduct an inspection on defect of a semiconductor composition or a crystal growth by obtaining an intensity image of a single wavelength range or of a wavelength distribution image based on the light due to the cathode luminescence at a specific wavelength or multiple wavelengths.

In the above-mentioned embodiments, the sensing device comprises the spectroscopic part and the sensing part, however, it may be otherwise such that only the light of a single wavelength area is derived to the sensing part (the detector) by an optical filter or the like without diving the light by the use of the spectroscopic part.

In addition, a part or all of the above-mentioned embodiment and the modified form of the embodiment may be combined arbitrarily. The present claimed invention is not limited to the above-mentioned embodiment, and there may be various modifications without departing from a spirit of the present claimed invention.

The invention claimed is:

1. A sample measuring device that measures light generated by irradiating energy beams on a sample, comprising:
   an energy beam generating part that generates energy beams,
   a electron optical column part that has an energy beam control device to converge the energy beams generated by the energy beam generating part and that converges the energy beams so as to make an axis of the energy beams coincide with an axis of the energy beam control device by the energy beam control device, and
   a light collecting mirror part that is arranged between the electron optical column part and the sample and that has an energy beam path to pass the energy beams converged by the electron optical column part and to irradiate the energy beams on the sample and a mirror face whose focal point is set on an axis of the energy beam path, and that collects the light generated from the sample by the mirror face, wherein
   the light collecting mirror part is supported by the electron optical column part so that the axis of the energy beams coincides with the focal point, and is provided with a positioning structure that makes it possible to mount and dismount the electron optical column part and the light collecting mirror part respectively, and that also makes the electron optical column part support the light collecting mirror part so that the axis of the energy beams coincides with the focal point by positioning an axial line of the energy beam control device and the axial line of the energy beam path coaxially.

2. The sample measuring device described in claim 1, wherein the positioning structure comprises a convex structure arranged at either one of the electron optical column part and the light collecting mirror part and a concave structure arranged at the other of them and corresponding to the convex structure.

3. The sample measuring device described in claim 1, wherein the positioning structure is formed at least on an upper face of the light collecting mirror part and comprises a tubular convex portion whose inner circumferential face specifies the energy beam path and an inner circumferential face of the electron optical column part that is formed to be the same as an outer circumferential face of the tubular convex portion.

4. A sample measuring device that measures light generated by irradiating energy beams on a sample, comprising
   an energy beam generating part that generates energy beams,
   an objective lens that converges the energy beams generated by the energy beam generating part and that irradiates the energy beams on the sample, and
   a mirror face that collects the light generated from the sample on which the energy beams are irradiated,
   wherein at least a part of the objective lens is arranged closer to the sample than an energy beam incident end portion of the mirror face, and
   an electron optical column part having the objective lens and the mirror face, wherein
   the electron optical column part has an electron optical column body and a light collecting mirror part supported by the electron optical column body, the electron optical column body comprises the objective lens, and the light collecting mirror part comprises an energy beam path to pass the energy beams converged by the objective lens and to irradiate the energy beams on the sample, the mirror face whose focal point is set on an axis of the energy beam path, and a concave portion into which an end portion at a sample side of the electron optical column body fits, and
   at least a part of the objective lens is arranged closer to the sample than an energy beam incident end portion of the mirror face by inserting the end portion at the sample side of the electron optical column body into the concave portion.

5. The sample measuring device described in claim 4, wherein
   the light collecting mirror part is made of aluminum and functions as a grounded electrode of the objective lens.

* * * * *

UNITED STATES PATENT AND TRADEMARK OFFICE
CERTIFICATE OF CORRECTION

| | | |
|---|---|---|
| PATENT NO. | : 7,589,322 B2 | Page 1 of 1 |
| APPLICATION NO. | : 11/477085 | |
| DATED | : September 15, 2009 | |
| INVENTOR(S) | : Nishikata et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 562 days.

Signed and Sealed this

Twenty-first Day of September, 2010

David J. Kappos
*Director of the United States Patent and Trademark Office*